US007595986B2

(12) United States Patent  
Glover et al.

(10) Patent No.: US 7,595,986 B2  
(45) Date of Patent: Sep. 29, 2009

(54) CONTROLLING AIRFLOW IN A COMPUTER CHASSIS

(75) Inventors: Troy W. Glover, Raleigh, NC (US); Michael S. June, Raleigh, NC (US); Vinod Kamath, Raleigh, NC (US); Whitcomb R. Scott, III, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/936,104

(22) Filed: Nov. 7, 2007

(65) Prior Publication Data

US 2009/0116190 A1    May 7, 2009

(51) Int. Cl.  
*H05K 7/20* (2006.01)

(52) U.S. Cl. .................. 361/695; 361/694; 454/184

(58) Field of Classification Search ......... 361/687–695; 454/184  
See application file for complete search history.

(56) References Cited

U.S. PATENT DOCUMENTS

| | | | | |
|---|---|---|---|---|
| 4,399,485 | A | * | 8/1983 | Wright et al. ............... 361/693 |
| 4,894,749 | A | * | 1/1990 | Elko et al. .................. 361/690 |
| 5,245,508 | A | | 9/1993 | Mizzi |
| 5,313,362 | A | | 5/1994 | Hatada et al. |
| 5,781,412 | A | | 7/1998 | de Sorgo |
| 5,963,424 | A | * | 10/1999 | Hileman et al. ............. 361/695 |
| 6,031,717 | A | * | 2/2000 | Baddour et al. ............. 361/687 |
| 6,483,700 | B1 | * | 11/2002 | Malone et al. .............. 361/690 |
| 6,690,578 | B2 | | 2/2004 | Edelmann |
| 6,888,725 | B2 | | 5/2005 | Kubo et al. |
| 7,041,535 | B2 | | 5/2006 | Yamashita et al. |
| 7,068,505 | B2 | | 6/2006 | Kosugi |
| 7,215,552 | B2 | * | 5/2007 | Shipley et al. .............. 361/721 |
| 7,310,228 | B2 | * | 12/2007 | Chen .......................... 361/695 |
| 2005/0136825 | A1 | * | 6/2005 | Brooks et al. ............... 454/184 |
| 2005/0157467 | A1 | * | 7/2005 | Malone et al. .............. 361/690 |
| 2006/0215363 | A1 | * | 9/2006 | Shipley et al. .............. 361/695 |
| 2007/0091564 | A1 | | 4/2007 | Malone et al. |

* cited by examiner

*Primary Examiner*—Gregory D Thompson  
(74) *Attorney, Agent, or Firm*—John Biggers; Cynthia S. Seal; Biggers & Ohanian LLP.

(57) ABSTRACT

Computer chassis configured for controlled airflow including at least one component board; a segmented curtain suspended across a region of airflow in the computer chassis above the component board; and at least one component mounted on the component board displacing at least one segment of the segmented curtain creating an airflow channel under the displaced segment. Segmented curtains for controlling airflow in a computer chassis including one or more segments capable of being displaced by components mounted on a component board in the computer chassis; and one or more fasteners for suspending the segmented curtain across a region of airflow in the computer chassis. Controlling airflow in a computer chassis including inserting a component board into the computer chassis; displacing, a segment of a segmented curtain thereby creating an airflow channel; and providing airflow through the airflow channel created by the displacement of the segment of the segmented curtain.

13 Claims, 3 Drawing Sheets

CONTROLLING AIRFLOW IN A COMPUTER CHASSIS

BACKGROUND OF THE INVENTION

1. Field of the Invention

The field of the invention is data processing, or, more specifically, methods, computer chassis, and segmented curtains for controlling airflow in a computer chassis.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Computer components often exude a large amount of heat during operation of the computer system. Temperatures of components outside the typical operating temperatures specified for such components may result in unpredictable component behavior or component failure. In large computer systems including many components controlling the temperature of the components is critical. Fans are typically used to control temperatures in computer systems by exhausting hot air inside the computer system and drawing cooler air inside the computer system. Different components of the computer system however may require more or less airflow to effectively control their temperatures. It would therefore be useful to control the airflow in a computer system.

SUMMARY OF THE INVENTION

Computer chassis, segmented curtains, and methods for controlling airflow in a computer chassis are disclosed. The computer chassis includes at least one component board, the component board including one or more components mounted on the component board; a segmented curtain suspended across a region of airflow in the computer chassis above the component board, the segmented curtain including one or more segments; and at least one component mounted on the component board displacing at least one segment of the segmented curtain creating an airflow channel under the displaced segment. The segmented curtains include one or more segments capable of being displaced by components mounted on a component board in the computer chassis; and one or more fasteners for suspending the segmented curtain across a region of airflow in the computer chassis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
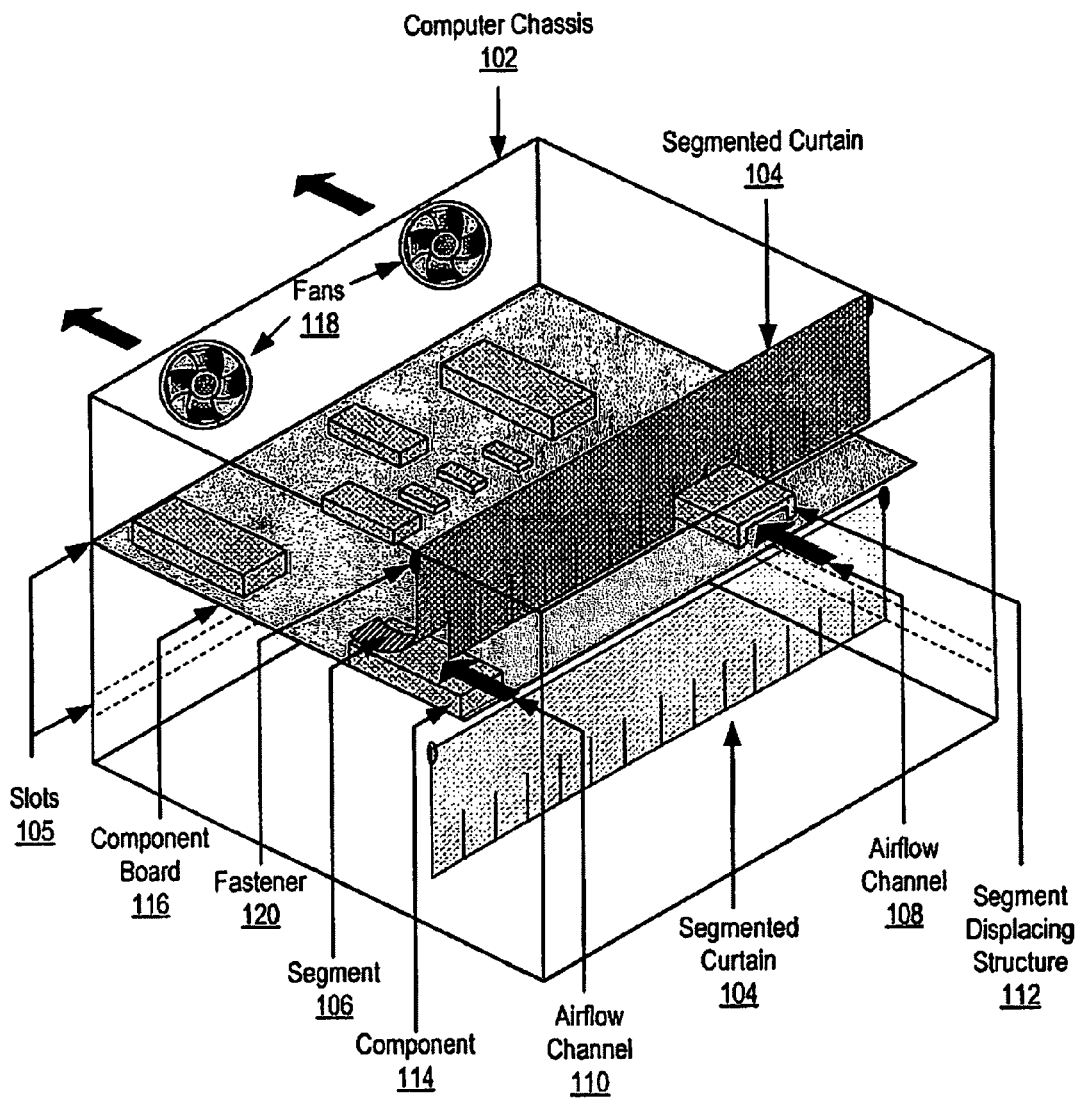
FIG. 1 sets forth a line drawing of an exemplary computer chassis configured for controlled airflow in accordance with embodiments of the present invention.

Exemplary methods, computer chassis, and segmented curtains for controlling airflow in a computer chassis in accordance with the present invention are described with reference to the accompanying drawings, beginning with FIG. 1. FIG. 1 sets forth a line drawing of an exemplary computer chassis (102) configured for controlled airflow in accordance with embodiments of the present invention. A computer chassis is an enclosure that contains the main components of one or more computers. Computer chassis may be constructed from steel, aluminum, or plastic, although other materials such as wood and Plexiglas have also been used to construct chassis. Computer chassis may be implemented in many different sizes, or form factors. A computer chassis according to embodiments of the present invention may be implemented, for example, as a personal computer chassis containing only a single computer system with various component boards for graphics, sound, and network functionality. A computer chassis may also be implemented as a computer equipment rack or a blade center chassis. A computer equipment rack is a system for mounting various electronic modules in a stack. Typical computer equipment racks are 19 wide and are divided into subracks or slots. Each subrack is typically measured in rack units. Each rack unit, designated as '1U,' is 1.75 inches in height. As an example, a typical rack may be a 19 inch, 24U rack, that is, 19 inches wide with 24, 1.75 inch high subracks. Typical computer equipment racks may include such electronic modules as servers, network switches, routers, power supplies, power distribution units, management modules, and other electronic modules as will occur to those of skill in the art. A blade center chassis is a chassis that typically contains computers in the form of blade servers as well as equipment supporting computer operations in a data center. In addition to a computer equipment rack and a blade center chassis, the exemplary computer chassis of FIG. 1 may be implemented in any other form factor as will occur to those of skill in the art.

The exemplary computer chassis (102) of FIG. 1 includes at least one component board (116). The component board (116) of FIG. 1 includes one or more components (114) mounted on the component board (116). A component board may be any electronic module having one or more components mounted upon it that is capable of being inserted into a computer chassis according to embodiments of the present invention. Examples of component boards include blade servers, Peripheral Component Interconnect ('PCI') cards, PCI Express cards, Accelerated Graphics Port ('AGP') Video cards, Industry Standard Architecture ('ISA') cards, and others as will occur to those of skill in the art. Components on component board may be any device typically used in such a component board. Examples of components mounted on a component board include heat sinks, resistors, computer processors, computer memory, hard drives, media drives, network interface devices, and others as will occur to those of skill in the art.

The exemplary computer chassis (102) of FIG. 1 also includes a segmented curtain (104) suspended across a region of airflow in the computer chassis (102) above the component board (116). In the exemplary computer chassis (102) of FIG.

1, the segmented curtain (104) includes one or more segments (106). The segmented curtain (104) of FIG. 1 is mounted to the exemplary computer chassis by a fastener (120). A fastener is a hardware device that mechanically joins or affixes two or more objects together.

The exemplary computer chassis (102) of FIG. 1 also includes at least one component (114) mounted on the component board (116) displacing at least one segment (106) of the segmented curtain (104) creating an airflow channel (110) under the displaced segment (106). An airflow channel is an area through which airflow is not blocked. That is, non-displaced segments of the segmented curtain block airflow while displaced segments create a channel for air to flow. A component board designer may, for example, design the placement of components on the component to displace particular segments of the segmented curtain in order to increase airflow to particular areas of the component board or to particular components mounted on the component board. In the exemplary computer chassis (102) of FIG. 1, airflow is provided by two computer fans (118). A computer fan is typically used for cooling purposes, and may refer to fans that draw cooler air into a computer chassis from outside the computer chassis while expelling warm air from inside of the computer chassis. A computer fan may also direct airflow across a heatsink to reduce the temperature of a particular component. The use of computer fans to reduce the temperature of components in a computer chassis is sometimes referred to as active cooling. Akasa™, Arctic Cooling™, Delta™, Nexus™, Noctua™, NorthQ™, ebmpapst™, and Zalman™ are examples of computer fan manufacturer.

In the exemplary computer chassis (102) of FIG. 1, the component board (116) also includes a segment displacing structure (112) mounted on the component board (116). A segment displacing structure is a structure, other than a component as described above, having a primary purpose of displacing segments of the segmented curtain. The segment displacing structure (112) of FIG. 1 may be used to direct airflow through the opening created by the structure to downstream components, that is, to components lacking sufficient airflow when segments of the segmented curtain are not displaced or when a component displaces the segment but blocks an amount of airflow downstream.

In addition to the segment displacing structure (112) providing airflow to downstream components through an opening beneath the segment displacing structure (112), the segment displacing structure (112) may also be mounted around a component mounted on the component board on three sides with separation between the segment displacing structure and the component. That is, a component may be located beneath the segment displacing structure (112) of FIG. 1 with a separation above the component and beneath the segment displacing structure. The separation above the component and beneath the segment displacing structure creates an airflow channel. Airflow may therefore be drawn directly across the top of the component beneath the segment displacing structure.

The arrangement of components, component boards, segment displacing structures, segments, segmented curtains, and other elements making up the exemplary computer chassis (102) illustrated in FIG. 1 are for explanation, not for limitation. Computer chassis useful according to various embodiments of the present invention may include additional elements not shown in FIG. 1, as will occur to those of skill in the art. The exemplary computer chassis (102) of FIG. 1 for example may include a plurality of slots (105) for installing component boards and a segmented curtain suspended across a region of airflow in each slot of the computer chassis. A slot is a receptacle for component boards. In 19 inch wide racks for example, a slot is typically a subrack as described above, 19 inches wide and 1U high. Various embodiments of the present invention may be implemented on a variety of hardware platforms in addition to those illustrated in FIG. 1.

Figure 2:
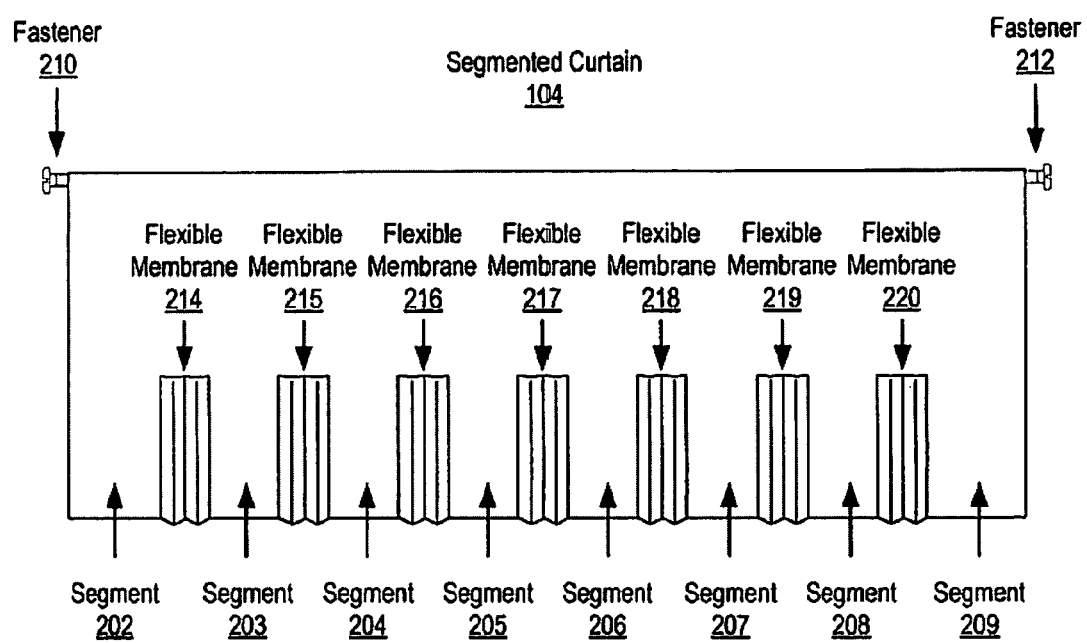
FIG. 2 sets forth a line drawing of an exemplary segmented curtain useful in controlling airflow in a computer chassis in accordance with embodiments of the present invention.

For further explanation FIG. 2 sets forth a line drawing of an exemplary segmented curtain (104) useful in controlling airflow in a computer chassis in accordance with embodiments of the present invention. The exemplary segmented curtain (104) of FIG. 2 includes one or more segments (202-209) capable of being displaced by components mounted on a component board in the computer chassis. The segments as well as the entire segmented curtain may be made of any material capable of enabling the segment to be displaced. The material used to construct the segments may be a stiff material that will not lift from airflow and that will return to a non-displaced position when not displaced by a component or segment displacing structure. The segments of the exemplary segmented curtain (104) of FIG. 2, for example may be made of plastic, rubber, or other materials as will occur to those of skill in the art.

The exemplary segmented curtain of FIG. 2 also includes one or more fasteners (210,212) for suspending the segmented curtain (104) across a region of airflow in the computer chassis. As mentioned above, a fastener is a hardware device that mechanically joins or affixes two or more objects together. Examples of fasteners include a batten, bolt, screw, buckle, clamp, clip, glue, cotter pin, retainer ring, or others as will occur to those of skill in the art. In one embodiment, for example, the fasteners (210,212) may be implemented as mounting pins extruding from the segmented curtain. Each mounting pin may be capable of insertion into a receptacle or hole in the computer chassis.

The segmented curtain of FIG. 2 also includes a flexible membrane (214-220) between segments of the segmented curtain (104). A flexible membrane is an accordion-like structure connecting two segments of a segmented curtain. A flexible membrane provides force to a displaced segment in the opposite direction of the displacement and also diverts airflow. That is, the flexible membrane may be used to ensure that a segment returns to its initial non-displaced position when not being displaced and to control the shape of an airflow channel when the segment is displaced.

Figure 3:
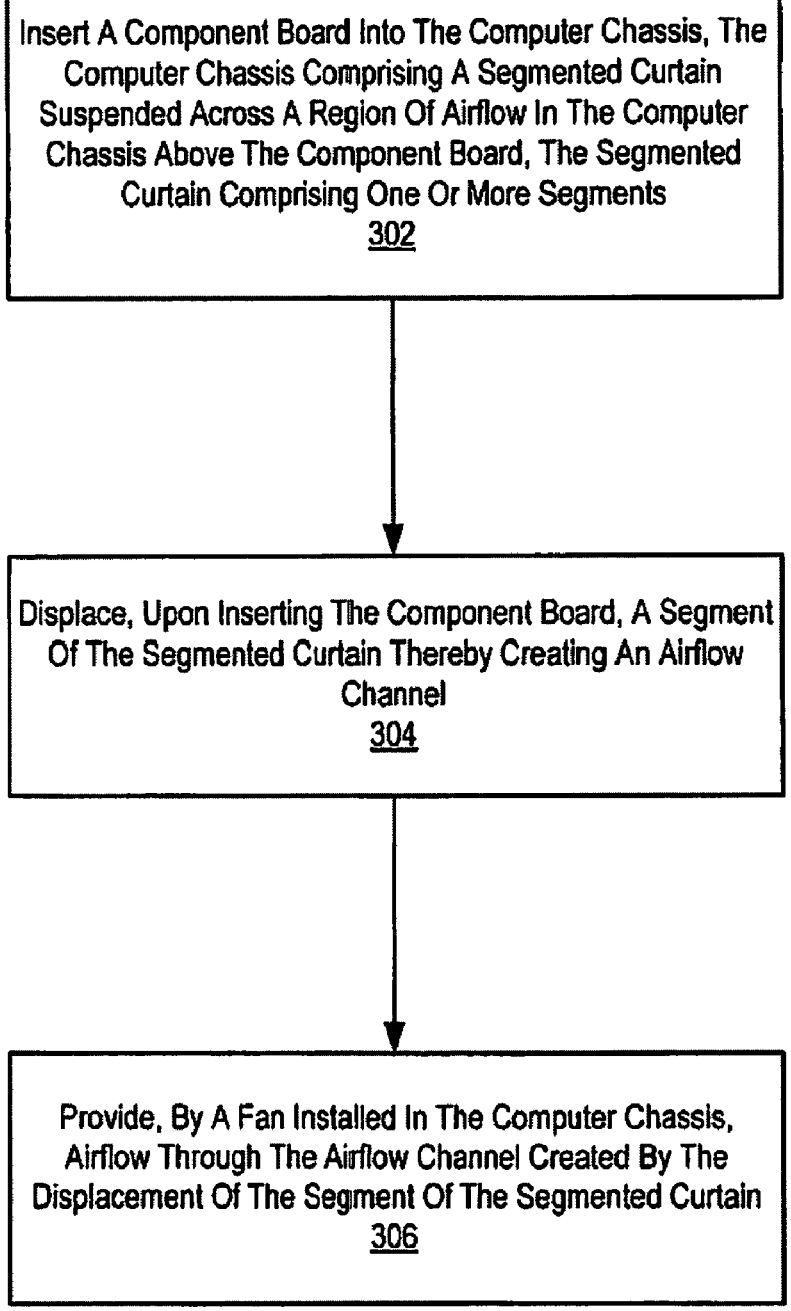
FIG. 3 sets forth a flow chart illustrating an exemplary method for controlling airflow in a computer chassis according to embodiments of the present invention.

For further explanation, FIG. 3 sets forth a flow chart illustrating an exemplary method for controlling airflow in a computer chassis according to embodiments of the present invention. The method of FIG. 3 includes inserting (302) a component board into the computer chassis. The computer chassis includes a segmented curtain suspended across a region of airflow in the computer chassis above the component board. The segmented curtain includes one or more segments. Inserting a component board into a computer chassis may be carried out by sliding the component board into a 1U slot in a 19 inch rack, sliding the component board into a slot in a blade center chassis, or installing the component board in a personal computer case.

The method of FIG. 3 also includes displacing (304), upon inserting the component board, a segment of the segmented curtain thereby creating an airflow channel. If the component board includes one or more components mounted on the component board, displacing (304) a segment of the segmented curtain may be carried out by displacing, by a component mounted on the component board, the segment of the segmented curtain. If the component board includes one or more segment displacing structure mounted on the component board, displacing (304) a segment of the segmented curtain may be carried out by displacing, by a segment displacing structure mounted on the component board, the segment of the segmented curtain.

The method of FIG. 3 also includes providing (306), by a fan installed in the computer chassis, airflow through the airflow channel created by the displacement of the segment of the segmented curtain. Providing (306), by a fan installed in the computer chassis, airflow through the airflow channel created by the displacement of the segment of the segmented curtain may be carried out by exhausting air from the compute chassis by the fan and directing, by the segments of the segmented curtain, airflow through a channel created by a component displacing a segment or by a segment displacing structure displacing a segment. Such a segment displacing structure may be mounted around a component on three sides with separation between the segment displacing structure and the component. In such cases providing (306) airflow through the airflow channel created by the displacement of the segment of the segmented curtain may be carried out by providing airflow through the separation between the segment displacing structure and the component.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer chassis, the computer chassis comprising:
   at least one component board, the component board comprising one or more components mounted on the component board;
   a segmented curtain suspended across a region of airflow in the computer chassis above the component board, the segmented curtain comprising one or more segments; and
   at least one component mounted on the component board displacing at least one segment of the segmented curtain creating an airflow channel under the displaced segment and above the at least one component.

2. The computer chassis of claim 1 wherein the component board further comprises a segment displacing structure mounted on the component board.

3. The computer chassis of claim 2 wherein the segment displacing structure is mounted around a component mounted on the component board on three sides with separation between the segment displacing structure and the component creating an airflow channel.

4. The computer chassis of claim 1 wherein the segmented curtain further comprises a flexible membrane between segments of the segmented curtain.

5. The computer chassis of claim 1 wherein the computer chassis further comprises a computer equipment rack.

6. The computer chassis of claim 1 wherein the computer chassis further comprises a blade center chassis.

7. The computer chassis of claim 1 wherein the computer chassis further comprises:
   a plurality of slots for installing component boards; and
   a segmented curtain suspended across a region of airflow in each slot of the computer chassis.

8. A segmented curtain for controlling airflow in a computer chassis, the segmented curtain comprising:
   one or more segments capable of being displaced by components mounted on a component board in the computer chassis to create an airflow channel under a displaced segment and above a component that displaces the displaced segment; and
   one or more fasteners for suspending the segmented curtain across a region of airflow in the computer chassis.

9. The segmented curtain of claim 8 further comprising:
   a flexible membrane between segments of the segmented curtain.

10. The segmented curtain of claim 8 wherein the one or more fasteners further comprise one or more mounting pins extruding from the segmented curtain, each of the one or more mounting pins capable of insertion into a receptacle in the computer chassis.

11. A method of controlling airflow in a computer chassis, the method comprising:
   inserting a component board into the computer chassis, the computer chassis comprising a segmented curtain suspended across a region of airflow in the computer chassis above the component board, the segmented curtain comprising one or more segments;
   displacing, upon inserting the component board by one of the components mounted on the component board, one of the one or more segments of the segmented curtain thereby creating an airflow channel; and
   providing, by a fan installed in the computer chassis, airflow through the airflow channel created by the displacement of the segment of the segmented curtain.

12. The method of claim 11 wherein:
   the component board further comprises one or more segment displacing structures mounted on the component board; and
   displacing, upon inserting the component board, one of the one or more segments of the segmented curtain thereby creating an airflow channel further comprises:
   displacing, by one of the one or more segment displacing structures mounted on the component board, the one of the one or more segments of the segmented curtain.

13. The method of claim 12 wherein:
   the one of the one or more segment displacing structures is mounted around a component mounted on the component board on three sides with separation between the one of the one or more segment displacing structures and the component; and
   providing airflow through the airflow channel created by the displacement of the segment of the segmented curtain further comprises:
   providing airflow through the separation between the one of the one or more segment displacing structures and the component.

* * * * *